United States Patent [19]
Ellingboe et al.

[11] Patent Number: 6,114,250
[45] Date of Patent: Sep. 5, 2000

[54] TECHNIQUES FOR ETCHING A LOW CAPACITANCE DIELECTRIC LAYER ON A SUBSTRATE

[75] Inventors: Susan Ellingboe, Fremont; Janet M. Flanner, Union City; Ian J. Morey, San Jose, all of Calif.

[73] Assignee: Lam Research Corporation, Fremont, Calif.

[21] Appl. No.: 09/135,419

[22] Filed: Aug. 17, 1998

[51] Int. Cl.[7] .................................................. H01L 21/00
[52] U.S. Cl. ............................................ 438/709; 438/710
[58] Field of Search ................................... 438/709, 710

[56] References Cited

U.S. PATENT DOCUMENTS

| | | | |
|---|---|---|---|
| 4,473,437 | 9/1984 | Higashikawa et al. | 156/643 |
| 4,529,860 | 7/1985 | Robb | 219/121 PE |
| 4,589,952 | 5/1986 | Behringer et al. | 156/628 |
| 4,855,017 | 8/1989 | Douglas | 156/643 |
| 5,213,989 | 5/1993 | Fitch et al. | 437/31 |
| 5,217,920 | 6/1993 | Mattox et al. | 437/67 |
| 5,273,609 | 12/1993 | Moslehi | 156/345 |
| 5,350,484 | 9/1994 | Gardner et al. | 156/628 |
| 5,405,492 | 4/1995 | Moslehi | 156/643 |
| 5,468,342 | 11/1995 | Nulty et al. | 156/643.1 |
| 5,562,801 | 10/1996 | Nulty | 156/643.1 |
| 5,569,355 | 10/1996 | Then et al. | 156/643.1 |

FOREIGN PATENT DOCUMENTS

| | | | |
|---|---|---|---|
| 58-087824 | 5/1983 | Japan | H01L 21/302 |
| 60-170238 | 3/1985 | Japan | H01L 21/302 |

OTHER PUBLICATIONS

Standaert et al., "High–Density Plasma Etching of Low Dielectric Constant Materials", Proceedings of the 1998 MRS Spring Symposium, San Francisco, CA, USA, Apr. 14–16, 1998, vol. 511, pp. 265–275.

*Primary Examiner*—Benjamin L. Utech
*Assistant Examiner*—Vanessa Perez-Ramos
*Attorney, Agent, or Firm*—Beyer Weaver & Thomas, LLP

[57] ABSTRACT

A method for etching through a low capacitance dielectric layer in a plasma processing chamber. The low capacitance dielectric layer is disposed below a hard mask layer on a substrate. The method includes flowing an etch chemistry that includes $N_2$ and $H_2$ into the plasma processing chamber. There is included creating a plasma out of the etch chemistry. The method also includes etching, using the plasma, through the low capacitance dielectric layer through openings in the hard mask layer in the plasma processing chamber.

20 Claims, 4 Drawing Sheets

TECHNIQUES FOR ETCHING A LOW CAPACITANCE DIELECTRIC LAYER ON A SUBSTRATE

BACKGROUND OF THE INVENTION

The present invention relates to the fabrication of semiconductor integrated circuits (IC's). More particularly, the present invention relates to improved techniques for etching through an IC layer stack, including the low capacitance dielectric layer, during IC fabrication.

In the manufacturing of certain semiconductor integrated circuits, a low dielectric constant (low-K) material may sometimes be employed as the material in the dielectric layer in order to reduce the capacitance of the devices that are formed and to improve their electrical performance. As in all dielectric layers, there is typically a need to etch vias or trenches through the dielectric layer in order to form metal interconnects therethrough. The invention herein addresses the process of forming a via/trench through the low capacitance dielectric layer.

To facilitate discussion, FIG. 1 illustrates a representative layer stack 100, including a photoresist layer 102, a hard mask layer 104, a low capacitance dielectric layer 106, and an etch stop layer 108. Etch stop layer 108 may represent, for example, an etch stop layer for a dual damascene process and is typically formed of a suitable etch stop material such as TiN, SiN, TEOS, or the like. Low capacitance dielectric layer 106 represents a layer of organic low-K material such as SILK by Dow Chemical, Flare by Allied Signal, BCB by Dow Chemical, Paiylene by Novellus, or the like.

Above low capacitance dielectric layer 106, there is shown disposed a hard mask layer 104, which is typically formed of a material such as SiN, SiON (silicon oxynitride) or TEOS. Hard mask layer 104 represents the masking layer that is employed to etch the via/trench in low capacitance dielectric layer 106. The hard mask layer is employed since photoresist is typically ineffective as a masking material when etching the organic low-K material of low capacitance dielectric layer 106. This is because the photoresist material and the organic low-K material tend to have similar chemical characteristics, tend to require a similar etch chemistry, and/or tend to have a similar etch rate. To pattern the hard mask out of hard mask layer 104, a photoresist layer 102 is provided. Photoresist layer 102 may represent, for example, a layer of deep UV or conventional photoresist material.

In FIG. 2, photoresist layer 102 is patterned using a conventional photoresist patterning process. The patterning of photoresist layer 102 creates an opening 202 through which hard mask layer 104 may be etched in a subsequent hard mask etch process.

In FIG. 3, a hard mask etch process is employed to extend opening 202 through hard mask layer 104. In one example, hard mask layer 104 represents a TEOS layer, and the hard mask etch process may take place in a plasma processing reactor using a suitable TEOS etch chemistry such as $Ar/C_4F_8/C_2F_6/O_2$ or a conventional TEOS etchant.

In FIG. 4, the low capacitance dielectric layer 106 is being etched. The etching of low capacitance dielectric layer 106 typically takes place in a plasma processing reactor. In the prior art, low capacitance dielectric layer 106 is typically etched using an oxygen-containing gas (such as $O_2$, CO, $CO_2$, or the like). A diluent such as $N_2$ or Ar is typically added to the etchant gas employed to etch through the low capacitance dielectric material. For reasons which shall be explained shortly hereinafter, a passivating agent such as a fluorocarbon gas is also typically added to the etch chemistry.

As is well known, the oxygen species employed to etch through low capacitance dielectric layer 106 tends to etch isotropically, causing the sidewalls in opening 202 to bow instead of maintaining the desired vertical sidewall profile. FIG. 5 illustrates the bowing sidewall that occurs when the etch is allowed to proceed isotropically through low capacitance dielectric layer 106. The bowing effect is exacerbated if over-etching is required to compensate for etch nonuniformity across the wafer. This bowing effect degrades profile control and causes difficulties in subsequent processing steps (such as metal fill).

To maintain profile control and prevent the aforementioned sidewall bowing problem, the prior art typically employs a passivating agent in addition to the oxygen-containing gas. Typically, the passivating agent is a fluorocarbon such as $C_4F_8$, $C_2HF_5$, $CH_2F_2$, or the like. While the addition of the fluorocarbon passivating agent helps preserve the vertical sidewall profile, it tends to facet first the photoresist and subsequently the hard mask, which in turn enlarges opening 202 as the etch proceeds through low capacitance dielectric layer 106.

To elaborate, the oxygen species that is employed to etch through the low capacitance dielectric layer also attacks the overlying photoresist material in photoresist layer 102. Consequently, the thickness of photoresist layer 102 is reduced as the etch proceeds through low capacitance dielectric layer 106. Because the oxygen species attacks the photoresist material isotropically, the photoresist mask often pulls back in regions 402 and 404 of the via/trench. As the photoresist material is worn away by the oxygen species and the photoresist material is pulled back in regions 402 and 404 of FIG. 4, the TEOS hard mask material of hard mask layer 104 is exposed to the fluorocarbon etchant that is added for passivation purposes. Since fluorocarbon is an etchant of TEOS, the exposed hard mask material in regions 408 and 410 are etched away as time goes on, causing the opening in hard mask layer 104 to enlarge. The enlargement of the opening in hard mask layer 104 in turn enlarges the via/trench to be etched through low capacitance dielectric layer 106. With this enlargement, the critical dimension of the via/trench is destroyed. The result is shown in FIG. 6 wherein the resultant via/trench has a larger cross-section than intended.

The use of a fluorocarbon additive also narrows the process window of the low capacitance dielectric layer etch. If too much fluorocarbon is added to the etch chemistry, the etch rate of the low capacitance dielectric layer will be reduced dramatically, until etch stoppage eventually occurs. If too little fluorocarbon is added, there may be insufficient passivation to maintain the desired vertical sidewall profile.

In view of the foregoing, there are desired improved techniques for etching through the low capacitance dielectric layer while maintaining the profile control and preserving the critical dimension of the resultant via/trench.

SUMMARY OF THE INVENTION

The present invention relates, in one embodiment, to a method for etching through a low capacitance dielectric layer in a plasma processing chamber. The low capacitance dielectric layer is disposed below a hard mask layer on a substrate. The method includes flowing an etch chemistry that includes $N_2$ and $H_2$ into the plasma processing chamber. There is included creating a plasma out of the etch chemistry. The method also includes etching, using the plasma, through the low capacitance dielectric layer through openings in the hard mask layer in the plasma processing chamber.

In accordance with one embodiment, the etch chemistry further includes an oxygen-containing gas. The flow rate of the oxygen-containing gas relative to the total flow rate of the etch chemistry is preferably below about 50% in one embodiment. In another embodiment, the plasma processing chamber represents an inductively coupled plasma processing chamber.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings, which are not drawn to scale to simplify the illustration and in which like reference numerals refer to similar elements.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with one aspect of the present invention, the organic low capacitance dielectric material of the low capacitance dielectric layer is etched in a plasma reactor using an etch chemistry that includes $N_2/H_2$, and optionally an oxygen-containing gas. It has been observed that although $H_2$ does not etch quickly through a low-K material such as FLARE, the addition of $N_2$, which typically does not etch low-K materials, significantly boosts the low-K material etch rate. While not wishing to be bound by theory, it is believed that the hydrogen species of the $N_2/H_2$ etchant gas chemically reacts with the low-K material (e.g., FLARE) to form byproducts which can be readily sputtered away by the nitrogen species.

Figure 1:
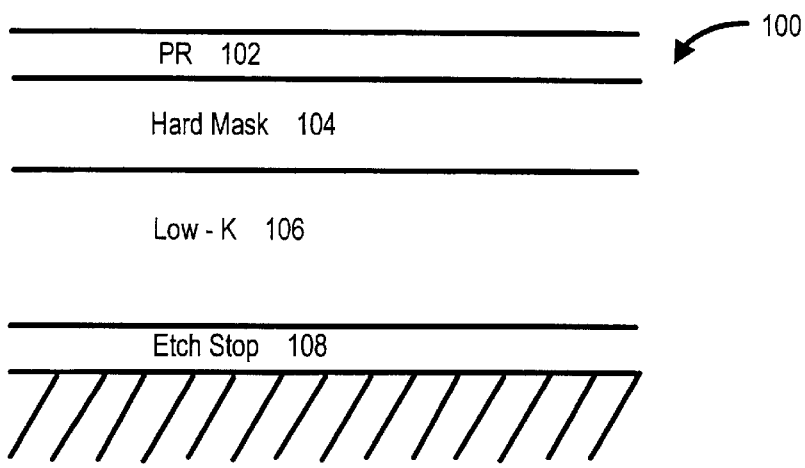
FIG. 1 illustrates an exemplary prior art IC layer stack.
Figure 2:
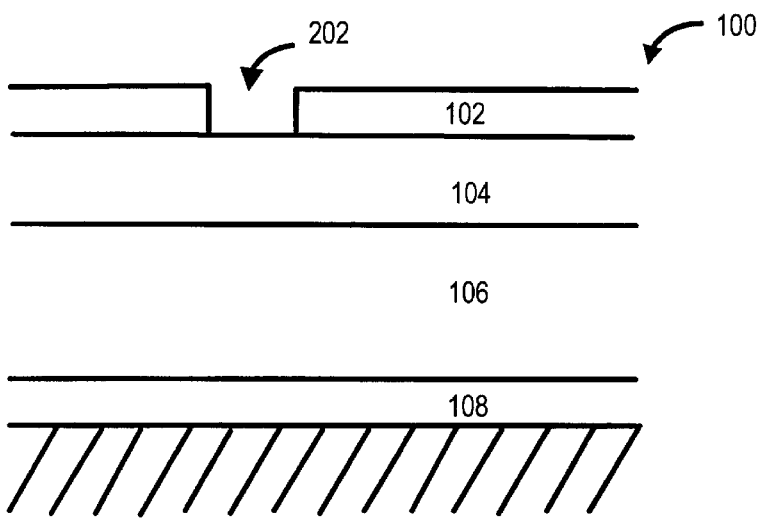
FIG. 2 illustrates the prior art IC layer stack of FIG. 1 after the photoresist layer is patterned.
Figure 3:
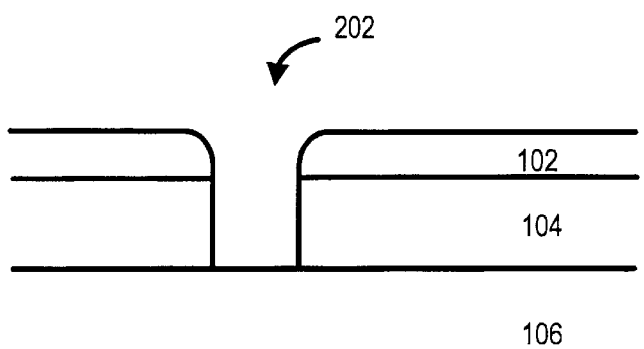
FIG. 3 illustrates the prior art IC layer stack of FIG. 1 after the hard mask layer is patterned.
Figure 3:
Figure 4:
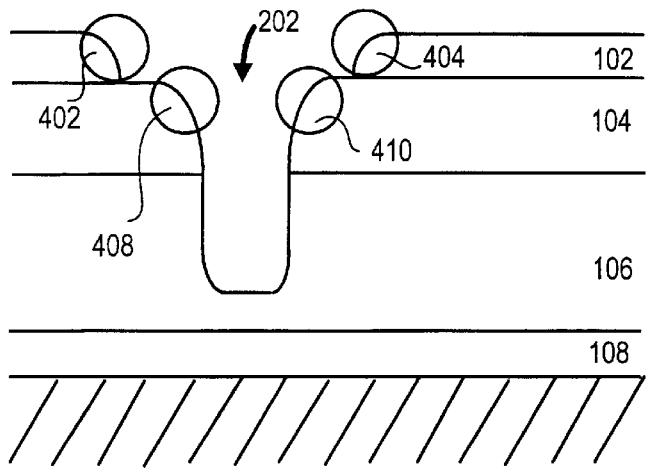
FIG. 4 illustrates the beginning of the etch through the low capacitance dielectric layer and the pull back of the photoresist which occurs.
Figure 5:
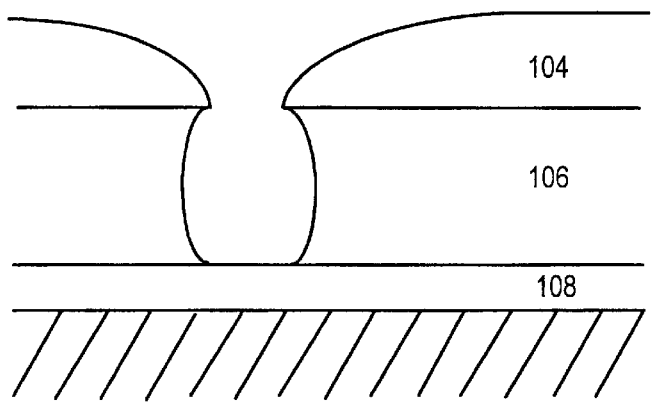
FIG. 5 illustrates the bowing that may occur in the sidewalls of the via when the prior art etch chemistry is employed to etch through the low capacitance dielectric layer.
Figure 6:
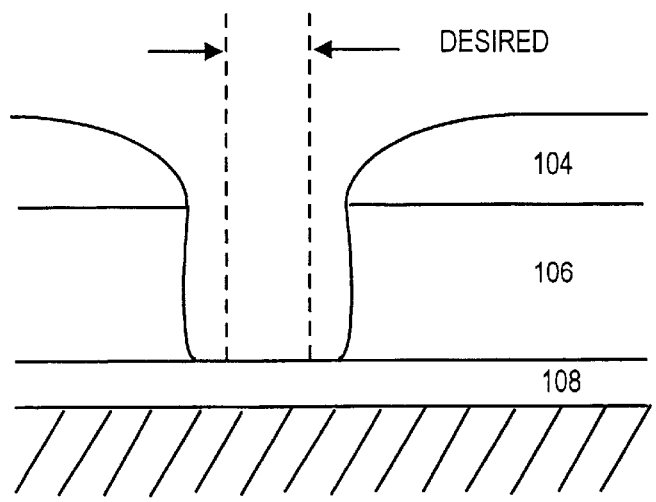
FIG. 6 illustrates the degradation of the critical dimension of the via that may occur when the prior art etch chemistry is employed to etch through the low capacitance dielectric layer.

More significantly, it is observed that the use of an etchant gas that includes $N_2/H_2$ to etch through the low capacitance dielectric layer yields improved photoresist selectivity, which extends the life of the protective photoresist mask that is disposed above the hard mask. With reference back to prior art FIG. 4, the photoresist mask 102 therein tends to get etched away quickly during the low-K etch due to the use of an etch chemistry that is predominantly oxygen-containing. In the absence of the protective photoresist mask, significant faceting of the hard mask occurs. With improved photoresist selectivity, the hard mask is protected for a longer period of time by the overlying photoresist material, which reduces hard mask faceting during the low-K etch and the concomitant critical dimension degradation that is caused when the openings in the hard mask are enlarged.

Further, it has been observed in the exemplary etches performed that the use of an etch chemistry that includes $N_2/H_2$ appears to promote anisotropic etching over a wider process window than that offered by the prior art oxygen-containing/fluorocarbon combination. While not wishing to be bound by theory, it is believed that the passivation that is formed by the $N_2/H_2$-containing etch chemistry offers significantly improved resistance to lateral etching, which allows the sidewalls to remain vertical through the low capacitance dielectric layer.

The use of the $N_2/H_2$ etch chemistry also offers other nonobvious advantages when employed to etch through the low capacitance dielectric layer of a wafer whose hard mask had been etched earlier using a fluorocarbon-based etchant in the same plasma reactor. This is because the hydrogen species acts as a getter material to remove reactive fluorine species, after the hard mask etch, from the plasma processing chamber, particularly from the surfaces of the plasma processing chamber. Increased fluorine species removal from the plasma processing chamber increases hard mask selectivity during the subsequent low-K dielectric etch since fluorine species etch the hard mask. With increased hard mask selectivity, critical dimension control is improved. It is also believed that fluorine species may contribute to the bowing effect observed on the sidewalls of the via/trench in the low-K dielectric layer. By gettering the reactive fluorine species, the $N_2/H_2$ gas also helps improve etch anisotropy.

Figure 7:
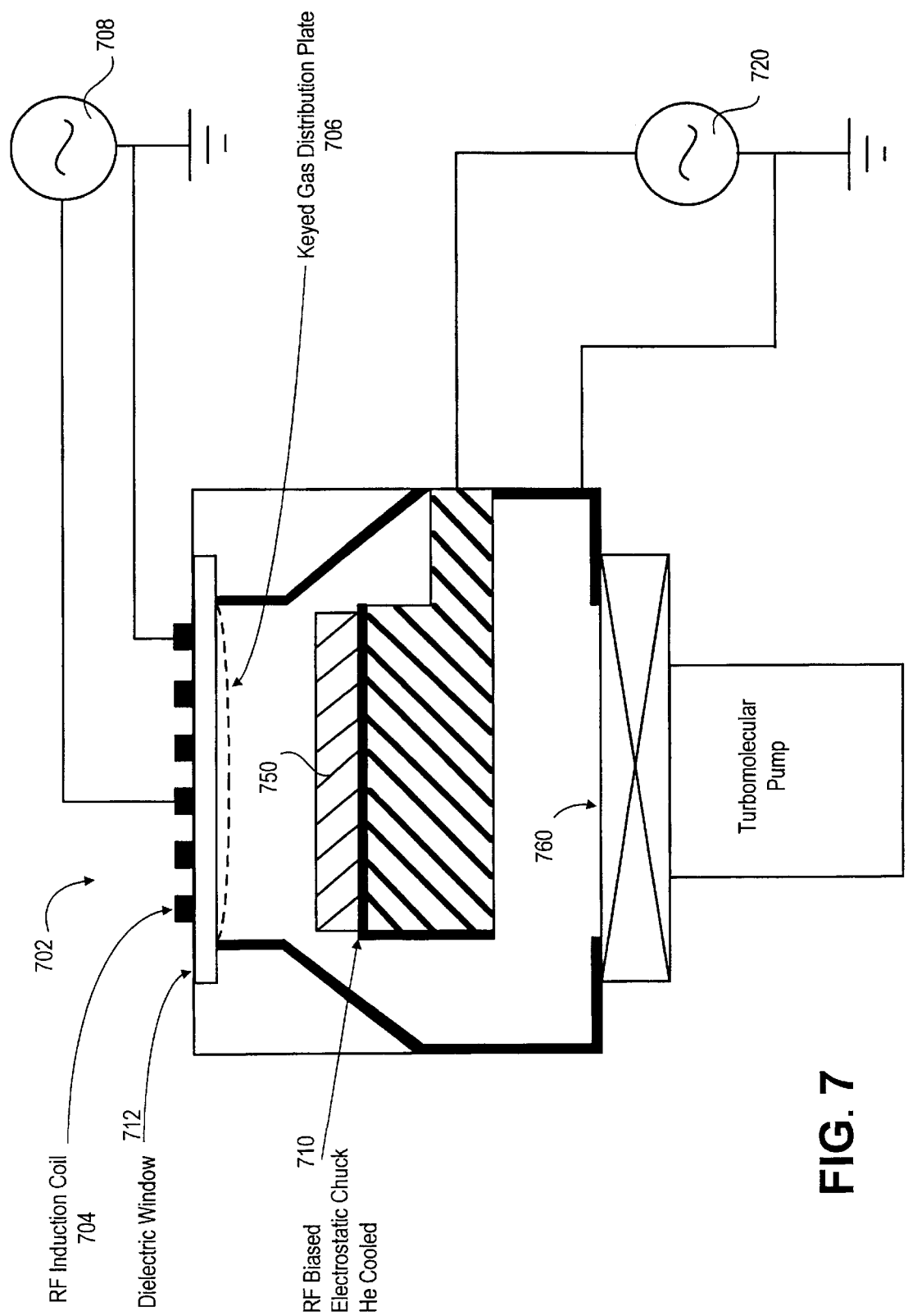
FIG. 7 illustrates a simplified schematic of the TCP™ 9100PTX plasma reactor, representing one of the plasma reactors suitable for practicing the present invention.

It is contemplated that the inventive low capacitance dielectric material etch technique may be practiced in any suitable plasma processing reactors, including capacitive-type reactors and low pressure, high density (e.g., >$10^{12}$ ions/cm$^3$) reactors. In a preferred embodiment, the present invention is practiced in an inductively coupled plasma processing reactor such as the TCP™ 9100PTX plasma reactor, which is available from Lam Research Corporation. FIG. 7 illustrates a simplified schematic of the TCP™ 9100PTX plasma reactor, including a plasma processing chamber 702. A dielectric window 712 is disposed below an electrode 704 and acts as the dielectric window through which the plasma within plasma processing chamber 702 may inductively couple with electrode 704. Electrode 704 represents the RF induction source and is implemented by a coil in the example of FIG. 7. Coil 704 is energized by a RF generator 708 via a matching network (conventional and not shown in FIG. 7 to simplify the illustration). The RF frequency of RF generator 708 may be about 13.56 MHz in one embodiment although other suitable RF frequencies may also be employed.

Within chamber 702, there may be provided a gas distribution plate 706, which preferably includes a plurality of holes for releasing gaseous source materials, e.g., the etch chemistryes, into the RF-induced plasma region between gas distribution plate 706 and a wafer 750. The gaseous source materials may also be released from ports built into the walls of the chamber itself. Wafer 750 is introduced into chamber 702 and disposed on a chuck 710, which acts as a second electrode and is preferably biased by a radio frequency generator 720 (also typically via a matching network). The RF frequency of RF generator 720 may be about 4 MHz in one embodiment although other suitable RF frequencies may also be employed. Wafer 750 may be secured to chuck 720 using a conventional mechanical clamping technique or one that employs electrostatic clamping forces.

Helium cooling gas is introduced under pressure between chuck 710 and wafer 750 to act as a heat transfer medium for accurately controlling the wafer's temperature during processing to ensure uniform and repeatable etching results.

During plasma etching, the pressure within chamber 702 is preferably kept low by evacuating gas through port 760, e.g., between about 1 mTorr to about 30 mTorr during the low-K dielectric etching.

Figure 8:
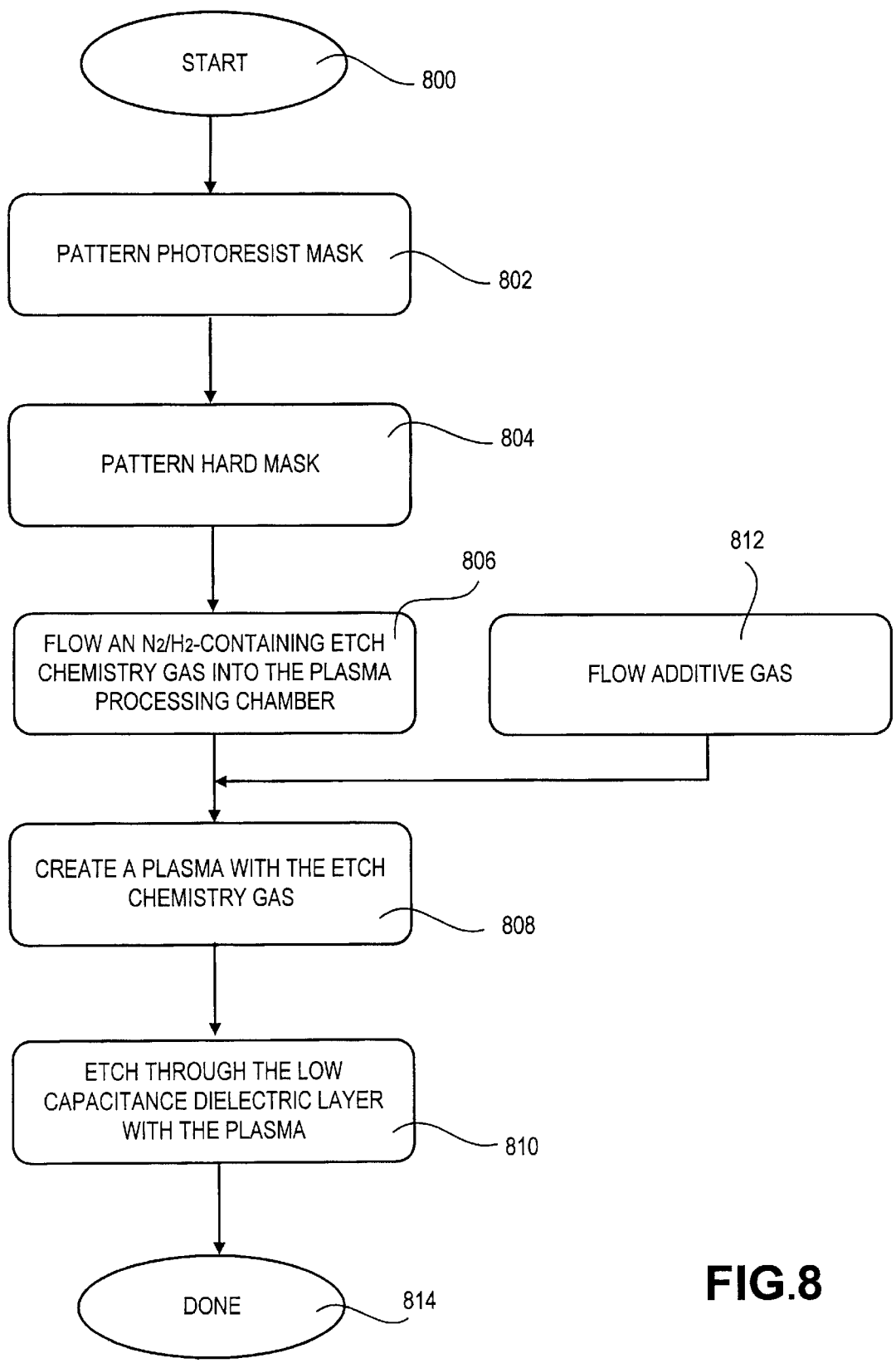
FIG. 8 illustrates, in accordance with one embodiment of the present invention, a flowchart of the steps of the inventive low capacitance dielectric etch.

FIG. 8 illustrates, in accordance with one embodiment of the present invention, a flowchart of the steps of the inventive low-K dielectric etch. In step 802, the photoresist mask is patterned using a conventional photoresist patterning process. In step 804, the hard mask is patterned out of the hard mask layer using the earlier created photoresist mask. That is, openings in the hard mask that correspond to the openings to be formed in the low capacitance dielectric layer are etched in step 804. As the term is used herein, the openings in the low capacitance dielectric layer refer to features etched in the low capacitance dielectric layer and include both trenches and vias.

In steps 806, 808, 810, and optionally 812, the low capacitance dielectric layer is etched. The etching of the low capacitance dielectric layer may take place in a separate plasma processing chamber, or more preferably, in the same plasma processing chamber that is employed for the hard mask etch. In step 806, an $N_2/H_2$-containing etch chemistry is flowed into the plasma processing chamber. In step 808, a plasma is created out of the $N_2/H_2$-containing etch chemistry. In step 810, the plasma that is created out of the $N_2/H_2$-containing etch chemistry is allowed to etch through the low capacitance dielectric material of the low capacitance dielectric layer through the openings in the hard mask. After the low capacitance dielectric layer is etched through, the low capacitance dielectric etch process ends at step 814. In some cases, however, an overetch step may be employed to compensate for any etch nonuniformity across the wafer. Thereafter, conventional processing steps may be employed to form integrated circuits from the etched wafer.

As shown in step 812, additional gases may also be added to the $N_2/H_2$-containing etch chemistry. By way of example, a diluent such as argon may be added. As another example, an oxygen-containing gas (such as $SO_2$, $CO_2$, CO, or $O_2$) may be added to the $N_2/H_2$-containing etch chemistry. Preferably, the oxygen-containing gas does not represent the predominant gas in the etchant gas mix (as measured by percentage of total flow). This is because while the presence of oxygen species may accelerate the etch rate through the low capacitance dielectric layer and aid in photoresist residue removal, an etch chemistry that is predominated by oxygen-containing gases (as in the case of the prior art) would cause undesirable degradation in the etch profile. By adding only small amounts of oxygen-containing gas to the $N_2/H_2$-containing etch chemistry, the etch rate through the low capacitance dielectric material may be improved without degrading the etch profile.

In one example, the wafer to be etched represents a 200 mm wafer having thereon a layer of the low capacitance dielectric material FLARE 2.0 underlying a hard mask layer formed of TEOS. The low capacitance dielectric layer is about 7,500 angstroms thick, and the hard mask layer is about 2,000 angstroms thick. The photoresist mask represents a deep UV photoresist mask, although any type of photoresist material may be employed. The openings to be etched have a cross-section of about 0.3 microns. The low capacitance dielectric layer etch is performed in a high density, low pressure inductively coupled plasma processing reactor known as the TCP™ 9100PTX, available from Lam Research Corp. of Fremont, Calif.

In the aforementioned TCP™ 9100PTX plasma processing system, the pressure within the plasma processing chamber may be between about 1 milliTorr (mT) and about 30 mT, more preferably between about 5 mT and about 15 mT, and preferably at about 7 mT. The top electrode power may be between about 700 watts and about 2,000 watts, more preferably between about 800 watts and about 1,800 watts, and preferably at about 1,300 watts. The bottom electrode power may be between about 50 watts and about 800 watts, more preferably between about 100 watts and about 700 watts, and preferably at about 300 watts.

The percentage flow of $N_2$ expressed as a percentage of total flow may be between about 10% and about 95%, more preferably between about 20% and 90% and preferably at about 50%. The percentage flow of $H_2$ expressed as a percentage of total flow may be between about 5% and about 90%, more preferably between about 5% and 80% and preferably at about 50%. As mentioned before, additional oxygen-containing gases may also be added to the $N_2/H_2$ containing etch chemistry mix. By way of example, $O_2$ may be added, and the percentage flow of $O_2$ expressed as a percentage of total flow may be up to about 15%, more preferably up to about 10%. As another example, $CO_2$ may also be added, and the percentage flow of $CO_2$ expressed as a percentage of total flow may be between about 0% and about 50%, more preferably between about 0% and 45% and preferably at about 35%. In one exemplary etch, advantageous etch results were observed when $CO_2$ is added to an etch chemistry mixture having a ratio of $N_2:H_2$ of 95:5.

As can be appreciated from the foregoing, the inventive low capacitance dielectric etch that employs an $N_2/H_2$-containing etch chemistry advantageously reduces hard mask faceting to facilitate a higher degree of critical dimension control. The hard mask faceting reduction is a result, in part, of the improved photoresist selectivity that the $N_2/H_2$-containing etch chemistry offers. As mentioned before, the improved photoresist selectivity allows the protective photoresist mask to remain above the hard mask for a longer period of time, thereby reducing erosion of the hard mask during the low capacitance dielectric etch.

It is believed that reduced hard mask faceting and/or improved etch anisotropy is also achieved through the gettering action of the hydrogen species, which reduces the concentration of the reactive fluorine species during the low capacitance dielectric etch. The use of an $N_2/H_2$-containing etch chemistry in place of the prior art $O_2$-containing etch chemistry also reduces bowing in the sidewalls of the openings in the low capacitance dielectric layer, thereby improving the etch profile.

While this invention has been described in terms of several preferred embodiments, there are alterations, permutations, and equivalents which fall within the scope of this invention. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:

1. A method for etching through a layer of organic dielectric material in a plasma processing chamber, said layer of organic dielectric material being disposed below a hard mask layer on a substrate, comprising:

flowing an etch chemistry that includes $N_2$ and $H_2$ into said plasma processing chamber;

creating a plasma out of said etch chemistry;

etching, using said plasma, through said layer of organic dielectric material through openings in said hard mask layer in said plasma processing chamber.

2. The method of claim 1 wherein said etch chemistry further includes an oxygen-containing gas, a flow rate of said oxygen-containing gas being below about 50% of a total flow rate of said etch chemistry.

3. The method of claim 1 wherein said hard mask layer is formed of TEOS.

4. The method of claim 3 wherein said plasma processing chamber represents a low pressure, high density plasma processing chamber.

5. The method of claim 3 wherein said plasma processing chamber represents an inductively coupled plasma processing chamber.

6. The method of claim 1 wherein the percentage of flow of $N_2$ is between 10% and 95% of a total flow rate.

7. The method of claim 6 wherein the percentage of flow of $N_2$ is between 20% and 90% of a total flow rate.

8. The method of claim 7 wherein the percentage of flow of $N_2$ is approximately 50% of a total flow rate.

9. The method of claim 1 wherein the percentage of flow of $H_2$ is between 5% and 90% of a total flow rate.

10. The method of claim 2 wherein the oxygen containing gas comprises at least one of $SO_2$, $CO_2$, $CO$ and $O_2$.

11. The method of claim 10 wherein the $N_2$ and $H_2$ are present in the etch chemistry at a ratio of about 95:5 and said oxygen containing gas comprises $CO_2$ at about 35% of the total flow.

12. The method of claim 4 wherein said plasma processing chamber is maintained at a pressure between 1 mTorr and 30 mTorr.

13. The method of claim 1 wherein said hard mask layer is disposed below a photoresist mask.

14. A method for etching a layer of organic dielectric material in a plasma processing chamber, said layer of organic dielectric material being disposed below a hard mask layer on a substrate, comprising:

etching said hard mask layer with a fluorocarbon-based etchant;

flowing an etch chemistry that includes $H_2$ into said plasma processing chamber, said etch chemistry substantially removing the fluorine species of said fluorocarbon based etchant;

creating a plasma out of said etch chemistry;

etching, using said plasma, through said layer of organic dielectric material through openings in said hard mask layer in said plasma processing chamber.

15. The method of claim 14 wherein said etch chemistry further includes $N_2$.

16. The method of claim 15 wherein said etch chemistry further includes an oxygen containing gas, a flow rate of said oxygen containing gas being below about 50% of a total flow rate of said etch chemistry.

17. The method in claim 14 wherein etching said hard mask layer and etching said layer of organic dielectric material are performed in a single processing chamber.

18. A method for etching a layer of organic dielectric material in a plasma processing chamber, said layer of organic dielectric material being disposed below a hard mask layer on a substrate, said hard mask layer being disposed below a photoresist mask, comprising:

patterning an opening in said photoresist mask;

patterning said hard mask layer using said opening in said photoresist mask;

flowing an etch chemistry that includes $N_2$ and $H_2$ into said plasma processing chamber;

creating a plasma out of said etch chemistry;

etching, using said plasma, through said layer of organic dielectric material through said opening in said hard mask layer in said plasma processing chamber.

19. The method in claim 18 further includes flowing an oxygen-containing gas into said plasma processing chamber, a flow rate of said oxygen containing gas being below about 50% of a total flow rate of said etch chemistry.

20. The method of claim 18 wherein patterning said photoresist and said hard mask occurs in the same plasma processing chamber as flowing the etch chemistry and creating the plasma.

* * * * *